United States Patent
Wagenblast et al.

(10) Patent No.: US 9,236,535 B2
(45) Date of Patent: Jan. 12, 2016

(54) ILLUMINATION DEVICES

(75) Inventors: Gerhard Wagenblast, Wachenheim (DE); Martin Koenemann, Mannheim (DE); Gerardus De Keyzer, Riehen (CH); Sorin Ivanovici, Heidelberg (DE); Michel Pepers, Neustadt (DE); Matthias Mueller, Pfungstadt (DE); Robert Send, Karlsruhe (DE)

(73) Assignee: BASF SE, Ludwigshafen (DE)

( * ) Notice: Subject to any disclaimer, the term of this patent is extended or adjusted under 35 U.S.C. 154(b) by 97 days.

(21) Appl. No.: 14/001,443

(22) PCT Filed: Feb. 23, 2012

(86) PCT No.: PCT/EP2012/053102
§ 371 (c)(1),
(2), (4) Date: Aug. 23, 2013

(87) PCT Pub. No.: WO2012/113884
PCT Pub. Date: Aug. 30, 2012

(65) Prior Publication Data
US 2013/0334546 A1    Dec. 19, 2013

Related U.S. Application Data

(60) Provisional application No. 61/446,139, filed on Feb. 24, 2011.

(30) Foreign Application Priority Data

Feb. 24, 2011 (EP) .................................. 11155901
May 9, 2011 (EP) .................................. 11165344

(51) Int. Cl.
*H01L 33/00* (2010.01)
*H01L 33/50* (2010.01)
(Continued)

(52) U.S. Cl.
CPC .............. *H01L 33/502* (2013.01); *C09K 11/06* (2013.01); *H05B 33/10* (2013.01); *H05B 33/14* (2013.01);
(Continued)

(58) Field of Classification Search
CPC .................. C09K 11/1007; C09K 2211/1011; C09K 2211/1029; C09K 2211/1014; H05B 33/14; H05B 33/10; H01L 33/502
USPC ................................ 257/88; 264/21; 252/301
See application file for complete search history.

(56) References Cited

U.S. PATENT DOCUMENTS

2007/0090755 A1   4/2007   Eida et al.
2008/0252198 A1   10/2008   Katano et al.
(Continued)

FOREIGN PATENT DOCUMENTS

CN    101908572 A    12/2010
CN    103154186 A    6/2013
(Continued)

OTHER PUBLICATIONS

International Search Report Issued Jul. 9, 2012 in PCT/EP12/053102 Filed Feb. 23, 2012.
(Continued)

*Primary Examiner* — Trung Q Dang
(74) *Attorney, Agent, or Firm* — Oblon, McClelland, Maier & Neustadt, L.L.P.

(57) ABSTRACT

Illumination device comprising at least one LED and at least one color converter comprising at least one organic fluorescent colorant in a matrix consisting essentially of polystyrene or polycarbonate, wherein LED and color converter are present in a remote phosphor arrangement.

19 Claims, 2 Drawing Sheets

Figure 1:
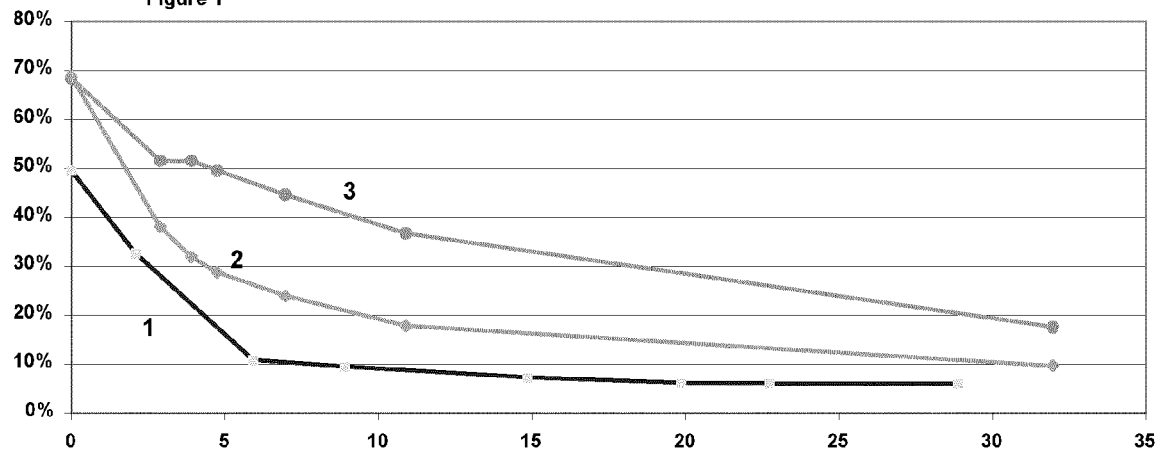

(51) Int. Cl.
*C09K 11/06* (2006.01)
*H05B 33/14* (2006.01)
*H05B 33/10* (2006.01)

(52) U.S. Cl.
CPC . *C09K 2211/1007* (2013.01); *C09K 2211/1011* (2013.01); *C09K 2211/1014* (2013.01); *C09K 2211/1029* (2013.01)

(56) References Cited

U.S. PATENT DOCUMENTS

| | | | |
|---|---|---|---|
| 2009/0021148 A1* | 1/2009 | Hachiya et al. | 313/504 |
| 2010/0164364 A1* | 7/2010 | Eida et al. | 313/499 |
| 2010/0307587 A1 | 12/2010 | Sakamoto et al. | |
| 2011/0143107 A1 | 6/2011 | Steinig-Nowakowski et al. | |
| 2011/0201190 A1 | 8/2011 | Hermes et al. | |
| 2011/0203649 A1 | 8/2011 | Könemann et al. | |
| 2011/0253988 A1 | 10/2011 | Molt et al. | |
| 2011/0266528 A1 | 11/2011 | Langer et al. | |
| 2011/0268647 A1 | 11/2011 | Ivanovici et al. | |
| 2011/0292570 A1 | 12/2011 | Ivanovici et al. | |
| 2011/0308592 A1 | 12/2011 | Könemann et al. | |
| 2011/0309343 A1 | 12/2011 | Langer et al. | |
| 2011/0309344 A1 | 12/2011 | Watanabe et al. | |
| 2011/0309346 A1 | 12/2011 | Watanabe et al. | |
| 2012/0007063 A1 | 1/2012 | Langer et al. | |
| 2012/0010636 A1* | 1/2012 | Boey et al. | 606/151 |
| 2012/0068123 A1 | 3/2012 | Sundarraj et al. | |
| 2012/0095222 A1 | 4/2012 | Schaefer et al. | |
| 2012/0168731 A1 | 7/2012 | Schildknecht et al. | |
| 2012/0199823 A1 | 8/2012 | Molt et al. | |
| 2012/0205645 A1 | 8/2012 | Fuchs et al. | |
| 2013/0032766 A1 | 2/2013 | Molt et al. | |
| 2013/0065168 A1 | 3/2013 | De Keyzer et al. | |
| 2013/0078393 A1 | 3/2013 | De Keyzer et al. | |
| 2013/0092874 A1 | 4/2013 | Bacher et al. | |
| 2013/0164635 A1 | 6/2013 | Schmidt et al. | |

FOREIGN PATENT DOCUMENTS

| | | |
|---|---|---|
| CN | 103459550 A | 12/2013 |
| DE | 10 2008 057 720 | 5/2010 |
| EP | 1 868 419 | 12/2007 |
| WO | 03 038915 | 5/2003 |
| WO | 2007 006717 | 1/2007 |
| WO | 2009 037283 | 3/2009 |
| WO | WO 2010/106478 A1 | 9/2010 |
| WO | WO 2012/042434 A1 | 4/2012 |
| WO | WO 2012/107852 A1 | 8/2012 |

OTHER PUBLICATIONS

U.S. Appl. No. 14/115,934, filed Nov. 6, 2013, Wagenblast et al.
U.S. Appl. No. 14/123,530, filed Dec. 3, 2013, Koenemann et al.
English Translation of Taiwanese Search Report issued in TW Application No. 101106252, Oct. 12, 2015, 1 page.

* cited by examiner

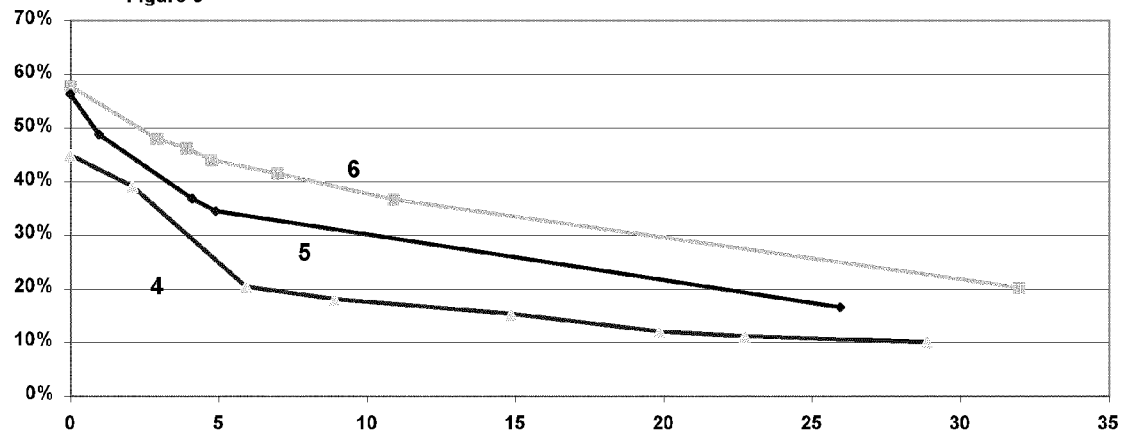
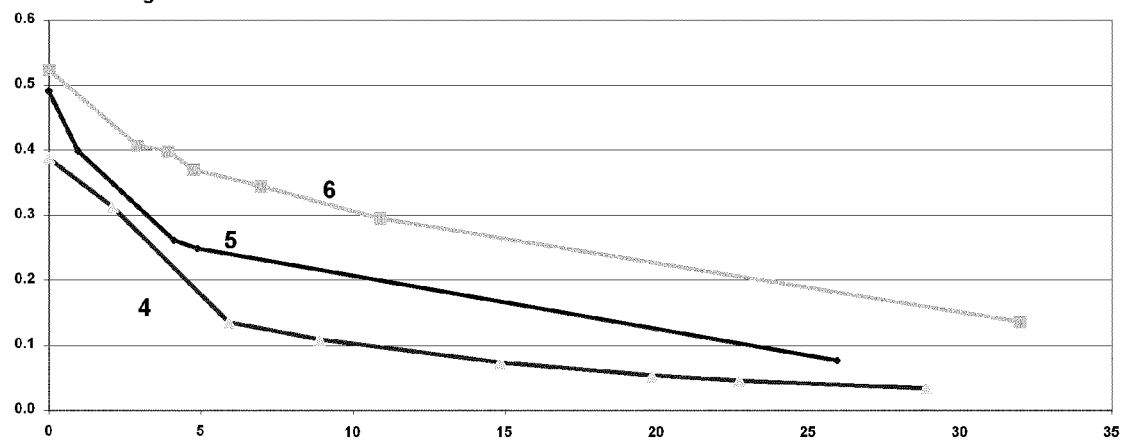

ILLUMINATION DEVICES

The present invention has for its subject-matter illumination devices comprising at least one LED and a colour converter comprising at least one organic fluorescent colorant in a matrix consisting essentially of polystyrene or polycarbonate, wherein LED and colour converter are present in a remote phosphor arrangement.

The invention further provides colour converters comprising at least one organic fluorescent colorant in a matrix consisting essentially of polystyrene or polycarbonate.

20% of global electrical energy consumption is required for lighting purposes.

Lighting equipment is the subject of further technical development with regard to the energy efficiency, colour reproduction, service life, manufacturing costs and usability thereof. Incandescent lamps and halogen lamps, being thermal radiators, produce light with very good colour reproduction since a broad spectrum is emitted with radiation characteristics approaching Planck's law of black body radiation and closely resembling sunlight. One disadvantage of incandescent lamps is the high power consumption thereof, since a very large amount of electrical energy is converted to heat.

A higher efficiency is possessed by compact fluorescent tubes, which produce a linear emission spectrum of mercury by discharge of an electrically excited mercury vapour. On the inside of these compact fluorescent tubes are phosphors comprising rare earths, which absorb some of the mercury emission spectrum and emit it as green and red light. The emission spectrum of a compact fluorescent tube is composed of different lines, which results in much poorer colour reproduction. The light of a compact fluorescent tube is perceived by many humans to be less natural and less pleasant than sunlight or light from incandescent lamps.

A longer lifetime and a very good energy efficiency are exhibited by most light-emitting diodes (LEDs). The light emission is based on the recombination of electron-hole pairs (excitons) in the junction area of a forward-biased semiconductor pn junction. The size of the band gap of this semiconductor determines the approximate wavelength. LEDs can be produced in different colours.

Stable and energy-efficient blue LEDs can produce white light by colour conversion. According to a known method for this purpose, a polymeric material comprising a radiation conversion phosphor is applied directly to the LED light source (LED chip). Frequently, the polymeric material is applied to the LED chip in approximately droplet or hemispherical form, as a result of which particular optical effects contribute to the emission of light. Such structures in which radiation conversion phosphor in a polymeric matrix is applied directly and without intervening space to an LED chip are also referred to as "phosphor on a chip". In phosphor on a chip LEDs, the radiation conversion phosphors used are generally inorganic materials. The radiation conversion phosphors, which may consist, for example, of cerium-doped yttrium aluminium garnet, absorb a certain proportion of the blue light and emit longer-wave light with a broad emission band, such that the mixing of the transmitted blue light and of the emitted light gives rise to white light.

In order to improve the colour reproduction of such lighting elements, it is additionally possible to incorporate a red-emitting diode as well as the white light diode described. This makes it possible to produce light which is perceived to be more pleasant by many people. However, this is more inconvenient and costly in technical terms.

In phosphor on a chip LEDs, the polymeric material and the radiation conversion phosphor are subject to relatively high thermal and radiative stress. For this reason, organic radiation conversion phosphors have not been suitable to date for use in phosphor on a chip LEDs. Organic fluorescent colorants can in principle produce good colour reproduction by virtue of their broad emission bands. However, they are to date not stable enough to withstand the thermal and radiative stresses in the case of direct arrangement on the LED chip.

In order to produce white light from blue light by colour conversion, there is a further concept in which the colour converter (also referred to simply as "converter"), which generally comprises a carrier and a polymeric coating, is a certain distance away from the LED chip. Such a structure is referred to as "remote phosphor".

The spatial distance between the primary light source, the LED, and the colour converter reduces the stress resulting from heat and radiation to such an extent that the requirements on the stability can be achieved by suitable organic fluorescent dyes. Furthermore, LEDs according to the "remote phosphor" concept are even more energy-efficient than those according to the "phosphor on a chip" concept. The use of organic fluorescent dyes in these converters offers various advantages. Firstly, organic fluorescent dyes give a much higher yield due to their substantially higher mass-specific absorption, which means that considerably less material is required for efficient radiation conversion than in the case of inorganic radiation converters. Secondly, they enable good colour reproduction and are capable of producing pleasant light. Furthermore, they do not require any materials comprising rare earths, which have to be mined and provided in a costly and inconvenient manner and are only available to a limited degree. It is therefore desirable to provide colour converters for LEDs which comprise suitable organic fluorescent dyes and have a long lifetime.

DE 10 2008 057 720 A1 describes the concept of remote phosphor LEDs and discloses, in addition to a conversion layer comprising inorganic radiation conversion phosphors, the use of organic radiation conversion phosphors embedded into a polymeric matrix. The polymeric matrices mentioned are, for example, silicones, epoxides, acrylates or polycarbonates.

WO 03/038915 A describes the use of perylene dyes as a radiation conversion phosphor for phosphor on a chip LEDs. In LEDs according to this document, the organic dyes are embedded into a matrix composed of a bisphenol A-based epoxy resin.

US 20080252198 discloses colour converters comprising a combination of red fluorescent dyes based on perylene derivatives with further fluorescent dyes. These are embedded into a transparent medium, which may be, for example, polyvinylpyrrolidone, polymethacrylate, polystyrene, polycarbonate, polyvinyl acetate, polyvinyl chloride, polybutene, polyethylene glycol, an epoxy resin.

It was an object of the present invention to provide illumination devices and colour converters based on organic fluorescent dyes, which do not have the disadvantages of the prior art and which especially have a long lifetime. In addition, they should have a high fluorescence quantum yield.

The object was achieved by the illumination devices and colour converters cited at the outset.

Inventive illumination devices comprise at least one LED and at least one colour converter. Colour converters likewise form part of the subject-matter of the present invention and comprise, in accordance with the invention, at least one organic fluorescent colorant in a matrix consisting essentially of polystyrene and/or polycarbonate.

In the context of this invention, colour converters are understood to mean devices which are capable of absorbing light of particular wavelengths and converting it to light of other wavelengths.

The LEDs of technical relevance are frequently blue LEDs which emit light with a peak wavelength of, for example, 420 to 480 nm, preferably 440 to 470 nm, most preferably at 445 to 460 nm.

According to the selection of the radiation conversion phosphors and of the wavelength absorbed, it is possible that inventive colour converters emit light in a wide variety of colours. In many cases, however, the aim is to obtain white light.

Radiation conversion phosphors include all materials which are capable of absorbing light of a particular wavelength and converting it to light of another wavelength. Such materials are also referred to as phosphors or fluorescent colorants.

Radiation conversion phosphors may, for example, be inorganic fluorescent colorants such as cerium-doped yttrium aluminium garnet, or organic fluorescent colorants. Organic fluorescent colorants may be organic fluorescent pigments or organic fluorescent dyes.

Inventive colour converters comprise at least one organic fluorescent colorant present embedded in a polymeric matrix consisting essentially of polycarbonate or polystyrene. Suitable organic fluorescent colorants are in principle all organic dyes or pigments which can absorb light of a particular wavelength and convert it to light of another wavelength, which can be dissolved or distributed homogeneously in a polymeric matrix, and which have sufficient stability to thermal and radiative stress.

Preferred organic pigments are, for example, perylene pigments.

Typically, suitable organic pigments have a mean particle size to DIN 13320 of 0.01 to 10 μm, preferably 0.1 to 1 μm.

Suitable organic fluorescent dyes fluoresce in the visible range of the spectrum and are, for example, the green-, orange-or red-fluorescing fluorescent dyes listed in the Colour Index.

Preferred organic fluorescent dyes are functionalized naphthalene or rylene derivatives.

Preferred naphthalene derivatives are green-, orange-or red-fluorescing fluorescent dyes comprising a naphthalene unit.

Preference is further given to naphthalene derivatives which bear one or more substituents selected from halogen, cyano, benzimidazole, or one or more radicals bearing carbonyl functions. Suitable carbonyl functions are, for example, carboxylic esters, dicarboximides, carboxylic acids, carboxamides.

Preferred rylene derivatives comprise a perylene unit. A preferred embodiment relates to green-, orange-or red-fluorescing perylenes.

Preference is given to perylene derivatives which bear one or more substituents selected from halogen, cyano, benzimidazole, or one or more radicals bearing carbonyl functions. Suitable carbonyl functions are, for example, carboxylic esters, carboximides, carboxylic acids, carboxamides.

Preferred perylene derivatives are, for example, the perylene derivatives specified in WO2007/006717 on page 1, line 5 to page 22, line 6.

In a particularly preferred embodiment, suitable organic fluorescent dyes are perylene derivatives selected from Formulae II to VI

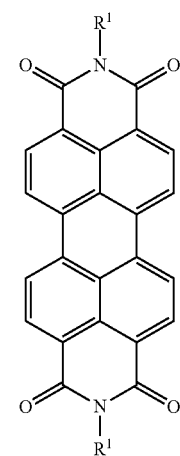

II

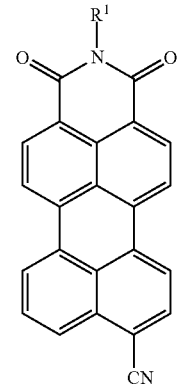

III

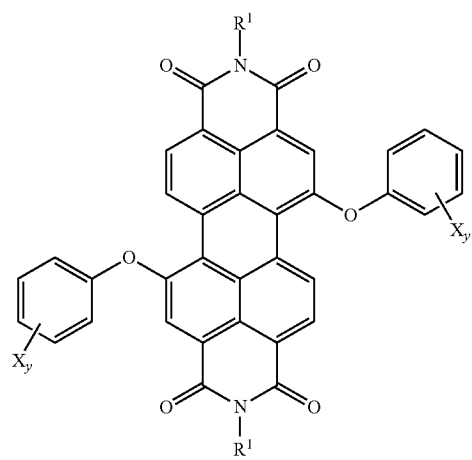

IV

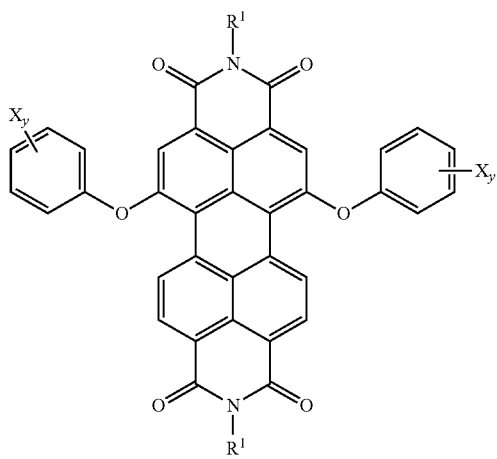

V

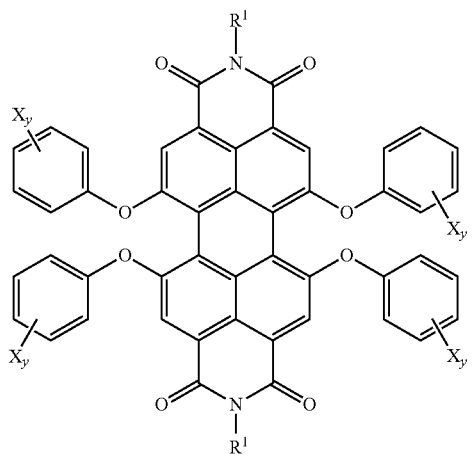

VI where $R^1$ is a linear or branched $C_1$-$C_{18}$ alkyl radical, a $C_4$-$C_8$ cycloalkyl radical which may be mono-or polysubstituted by halogen or by linear or branched $C_1$-$C_{18}$ alkyl, or phenyl or naphthyl, where phenyl and naphthyl may be mono-or polysubstituted by halogen or by linear or branched $C_1$-$C_{18}$ alkyl.

In one embodiment, $R^1$ in Formulae II to VI represents compounds with what is called swallowtail substitution, as specified in WO 2009/037283 A1 at page 16 line 19 to page 25 line 8. In a preferred embodiment, $R^1$ is a 1-alkylalkyl, for example 1-ethylpropyl, 1-propylbutyl, 1-butylpentyl, 1-pentylhexyl or 1-hexylheptyl.

In Formulae II to VI, X represents substituents in the ortho and/or para position. X is preferably linear or branched $C_1$ to $C_{18}$ alkyl.

"y" indicates the number of substituents X. "y" is a number from 0 to 3.

More preferably, $R^1$ in Formulae II to VI is 2,4-di(tert-butyl)phenyl or 2,6-disubstituted phenyl, especially preferably 2,6-diphenylphenyl, 2,6-diisopropylphenyl.

Especially preferably, X is tert-butyl in the ortho/para position and/or secondary alkyl, especially isopropyl, in the ortho positions or phenyl in the ortho positions.

According to a specific aspect of this embodiment, the organic fluorescent dyes are selected from N,N'-bis(2,6-diisopropylphenyl)-1,6-di(2,6-diisopropylphenoxy)-perylene-3,4:9,10-tetracarboximide, N,N'-bis(2,6-diisopropylphenyl)-1,7-di(2,6-diisopropylphenoxy)-perylene-3,4:9,10-tetracarboximide and mixtures thereof.

According to a further specific aspect of this embodiment, the organic fluorescent dye is N-(2,6-di(isopropyl)phenyl) perylene-3,4-dicarboxylic monoimide.

A further preferred fluoresecent dye is a dye of the Formula VI, e.g. N,N'-bis(2,6-diisopropylphenyl)-1,6,7,12-tetraphenoxyperylene-3,4:9,10-tetracarboxdiimide (Lumogen® Red 300).

In a further particularly preferred embodiment, suitable organic fluorescent dyes are perylene derivatives selected from Formulae VII to X,

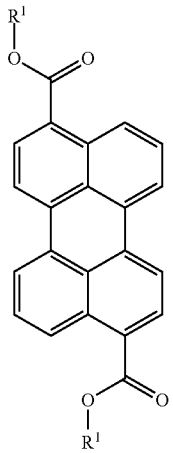

VII

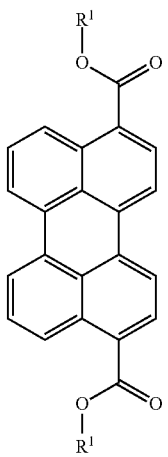

VIII

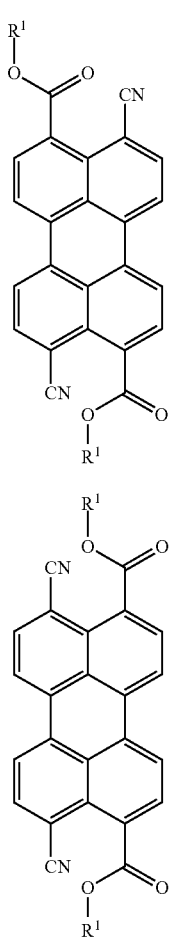

where $R^1$ in Formulae VII to X is a linear or branched $C_1$-$C_{18}$ alkyl radical, a $C_4$-$C_8$ cycloalkyl radical which may be mono- or polysubstituted by halogen or by linear or branched $C_1$-$C_{18}$ alkyl, or phenyl or naphthyl, where phenyl and naphthyl may be mono-or polysubstituted by halogen or by linear or branched $C_1$-$C_{18}$ alkyl.

In one embodiment, $R^1$ in Formulae VII to X represents compounds with what is called swallowtail substitution, as specified in WO 2009/037283 A1 at page 16 line 19 to page 25 line 8. In a preferred embodiment, $R^1$ is a 1-alkylalkyl, for example 1-ethylpropyl, 1-propylbutyl, 1-butylpentyl, 1-pentylhexyl or 1-hexylheptyl.

Especially preferably, $R^1$ in Formulae VII to X is linear or branched $C_1$ to $C_6$ alkyl, especially n-butyl, sec-butyl, 2-ethylhexyl. Especially preferably, $R^1$ in Formulae VII to X is also isobutyl.

According to a specific aspect of this embodiment, the organic fluorescent dyes are selected from 3,9-dicyanoperylene-4,10-bis(sec-butyl carboxylate), 3,10-dicyanoperylene-4,9-bis(sec-butyl carboxylate) and mixtures thereof.

According to a further specific aspect of this embodiment, the organic fluorescent dyes are selected from 3,9-dicyanoperylene-4,10-bis(isobutyl carboxylate), 3,10-dicyanoperylene-4,9-bis(isobutyl carboxylate) and mixtures thereof.

Further preferred fluorescent dyes are Disperse Yellow 199, Solvent Yellow 98, Disperse Yellow 13, Disperse Yellow 11, Disperse Yellow 239, Solvent Yellow 159

In a preferred embodiment, the at least one organic fluorescent colorant is selected from N,N'-bis(2,6-diisopropylphenyl)-1,7-di(2,6-diisopropylphenoxy)perylene-3,4:9,10-tetracarboxdiimide, N,N'-bis(2,6-diisopropylphenyl)-1,6-di(2,6-diisopropylphenoxy)perylene-3,4:9,10-tetracarboxdiimide, 3,9-dicyanoperylene-4,10-bis(sec-butyl carboxylate), 3,10-dicyanoperylene-4,9-bis(sec-butyl carboxylate), 3,9-dicyanoperylene-4,10-bis(isobutyl carboxylate), 3,10-dicyanoperylene-4,9-bis(isobutyl carboxylate), N-(2,6-di(isopropyl)phenyl)perylene-3,4-dicarboxylic monoimide and mixtures thereof.

In a preferred embodiment, colour converters comprise at least two different organic fluorescent dyes. For example, a green-fluorescing fluorescent dye can be combined with a red-fluorescing fluorescent dye. Green-fluorescing fluorescent dyes are understood to mean especially those yellow dyes which absorb blue light and emit green or yellow-green fluorescent light. Suitable red dyes absorb either the blue light of the LED directly or absorb the green light emitted by other dyes present, and transmit red fluorescent light.

In a less preferred embodiment, inventive colour converters comprise only a single organic fluorescent dye, for example an orange fluorescent dye.

According to the invention, organic fluorescent dyes are embedded into a matrix consisting essentially of polystyrene and/or polycarbonate.

When the organic fluorescent colorants are pigments, these are generally present dispersed in the matrix.

Organic fluorescent dyes may be present either dissolved in the matrix or as a homogeneously distributed mixture. The organic fluorescent dyes are preferably present dissolved in the matrix.

Suitable matrix materials are organic polymers consisting essentially of polystyrene and/or polycarbonate.

In a preferred embodiment, the matrix consists of polystryrene or polycarbonate.

Polystyrene is understood here to include all homo-or copolymers which result from polymerization of styrene and/or derivatives of styrene.

Derivatives of styrene are, for example, alkylstyrenes such as alpha-methylstyrene, ortho-, meta-, para-methylstyrene, para-butylstyrene, especially para-tert-butylstyrene, alkoxystyrene such as para-methoxystyrene, para-butoxystyrene, para-tert-butoxystyrene.

In general, suitable polystyrenes have a mean molar mass $M_n$ of 10 000 to 1 000 000 g/mol (determined by GPC), preferably 20 000 to 750 000 g/mol, more preferably 30 000 to 500 000 g/mol.

In a preferred embodiment, the matrix of the colour converter consists essentially or completely of a homopolymer of styrene or styrene derivatives.

In further preferred embodiments of the invention, the matrix consists essentially or completely of a styrene copolymer which, in the context of this application, are likewise considered to be polystyrene. Styrene copolymers may comprise, as further constituents, for example, butadiene, acrylonitrile, maleic anhydride, vinylcarbazole or esters of acrylic acid, methacrylic acid or itaconic acid as monomers. Suitable styrene copolymers comprise generally at least 20% by weight of styrene, preferably at least 40% by weight and more preferably at least 60% by weight of styrene. In another embodiment, they comprise at least 90% by weight of styrene. Preferred styrene copolymers are styrene-acrylonitrile copolymers (SAN) and acrylonitrile-butadiene-styrene copolymers (ABS), styrene-1,1'-diphenylethene copolymers, acrylic ester-styrene-acrylonitrile copolymers (ASA), methyl methacrylate-acrylonitrile-butadiene-styrene copolymers (MABS).

A further preferred polymer is alpha-methylstyrene-acrylonitrile copolymer (AMSAN).

The styrene homo-or copolymers can be prepared, for example, by free-radical polymerization, cationic polymerization, anionic polymerization, or under the influence of organometallic catalysts (for example Ziegler-Natta catalysis). This can lead to isotactic, syndiotactic, atactic polystyrene or copolymers. They are preferably prepared by free-radical polymerization. The polymerization can be performed as a suspension polymerization, emulsion polymerization, solution polymerization or bulk polymerization.

The preparation of suitable polystyrenes is described, for example, in Oscar Nuyken, Polystyrenes and Other Aromatic Polyvinyl Compounds, in Kricheldorf, Nuyken, Swift, New York 2005, p. 73-150 and references cited therein; and in Elias, Macromolecules, Weinheim 2007, p. 269-275.

Polycarbonates are polyesters of carbonic acid with aromatic or aliphatic dihydroxyl compounds. Preferred dihydroxyl compounds are, for example, methylenediphenylenedihydroxyl compounds, for example bisphenol A.

One means of preparing polycarbonates is the reaction of suitable dihydroxyl compounds with phosgene in an interfacial polymerization. Another means is the reaction with diesters of carbonic acid, such as diphenyl carbonate, in a condensation polymerization.

The preparation of suitable polycarbonates is described, for example, in Elias, Macromolecules, Weinheim 2007, p. 343-347.

In a preferred embodiment, polystyrenes or polycarbonates which have been polymerized with the exclusion of oxygen are used. The monomers preferably comprised, during the polymerization, a total of at most 1000 ppm of oxygen, more preferably at most 100 ppm and especially preferably at most 10 ppm.

Suitable polystyrenes or polycarbonates may comprise, as further constituents, additives such as flame retardants, antioxidants, light stabilizers, free-radical scavengers, antistats. Such stabilizers are known to those skilled in the art.

In a preferred embodiment of the invention, suitable polystyrenes or polycarbonates do not comprise any antioxidants or free-radical scavengers.

In one embodiment of the invention, suitable polystyrenes or polycarbonates are transparent polymers.

In another embodiment, suitable polystyrenes or polycarbonates are opaque polymers.

In one embodiment of the invention, the matrix consists essentially or completely of a mixture of polystyrene and/or polycarbonate with other polymers, but the matrix preferably comprises at least 25% by weight, more preferably 50% by weight, most preferably at least 70% by weight, of polystyrene and/or polycarbonate.

In another embodiment, the matrix consists essentially or completely of a mixture of polystyrene or polycarbonate in any ratio.

In another embodiment, the matrix consists of mixtures of different polystyrenes and polycarbonates.

In one embodiment, the matrix is mechanically reinforced with glass fibres.

It has been found that, surprisingly, the stability of the organic fluorescent colorant is increased in polystyrene or polycarbonate compared to other matrix materials.

For the execution of the invention, the geometric arrangement in which the organic fluorescent colorant-comprising matrix is present is not crucial. The organic fluorescent colorant-comprising matrix may be present, for example, in the form of films, sheets or plaques. The organic fluorescent colorant-comprising matrix may likewise be in droplet or hemispherical form, or in the form of lenses with convex and/or concave, flat or spherical surfaces.

Irrespective of the three-dimensional shape, inventive converters may, for example, consist of a single layer or have a multilayer structure.

When inventive colour converters comprise more than one fluorescent colorant, it is possible in one embodiment of the invention for several fluorescent colorants to be present alongside one another in one layer.

In another embodiment, the different fluorescent colorants are present in different layers.

In one embodiment of the invention, the organic fluorescent dye-comprising polymer layers (matrices) are 25 to 200 micrometres in thickness, preferably 35 to 150 µm and particularly 50 to 100 µm.

In another embodiment, the organic fluorescent dye-comprising polymer layers are 0.2 to 5 millimetres in thickness, preferably 0.3 to 3 mm, more preferably 0.4 to 1 mm.

When the colour converters consist of one layer or have a layer structure, the individual layers in a preferred embodiment are continuous and do not have any holes or interruptions, such that light emitted by the LED must in each case pass through at least one organic fluorescent colorant-comprising matrix.

The concentration of the organic fluorescent colorants in the matrix depends on factors including the thickness of the polymer layer. If a thin polymer layer is used, the concentration of the organic fluorescent colorant is generally higher than in the case of a thick polymer layer. The concentration of the organic fluorescent dyes is typically 0.001 to 0.5% by weight, preferably 0.002 to 0.1% by weight, most preferably 0.005 to 0.05% by weight, based in each case on the amount of the matrix material.

Organic pigments are generally used in a concentration of 0.001 to 0.5% by weight, preferably 0.005 to 0.2% by weight, more preferably 0.01 to 0.1% by weight, based in each case on the amount of the matrix material.

In a preferred embodiment, at least one of the layers or matrices comprising organic fluorescent dye comprises scattering bodies for light.

In a further preferred embodiment of the multilayer structure, several layers comprising fluorescent dye and one or more layers comprising scatterers without fluorescent dye are present.

Suitable scattering bodies are inorganic white pigments, for example titanium dioxide, barium sulphate, lithopone, zinc oxide, zinc sulphide, calcium carbonate with a mean particle size to DIN 13320 of 0.01 to 10 µm, preferably 0.1 to 1 µm, more preferably 0.15 to 0.4 µm.

Scattering bodies are included typically in an amount of 0.01 to 2.0% by weight, preferably 0.05 to 0.5% by weight, more preferably 0.1 to 0.4% by weight, based in each case on the polymer of the layer comprising scattering bodies.

Inventive colour converters may optionally comprise further constituents, such as a carrier layer. Carrier layers serve to impart mechanical stability to the colour converter. The type of material of the carrier layers is not crucial, provided that it is transparent and has the desired mechanical strength. Suitable materials for carrier layers are, for example, glass or transparent rigid organic polymers, such as polycarbonate, polystyrene or polymethacrylates or polymethyl methacrylates.

Carrier layers generally have a thickness of 0.1 mm to 10 mm, preferably 0.3 mm to 5 mm, more preferably 0.5 mm to 2 mm.

Inventive colour converters are suitable for the conversion of light produced by LEDs.

Inventive colour converters can be used in combination with LEDs in virtually any geometric form and independently of the structure of the illumination device.

Preference is given to using inventive colour converters in a remote phosphor structure. The colour converter here is spatially separated from the LED. In general, the distance between LED and colour converter is from 0.1 cm to 50 cm, preferably 0.2 to 10 cm and most preferably 0.5 to 2 cm. Different media such as air, noble gases, nitrogen or other gases or mixtures thereof may be present between colour converter and LED.

The colour converter may, for example, be arranged concentrically around the LED, or in the form of a flat layer, plaque or sheet.

Inventive colour converters and illumination devices exhibit, on irradiation with LED light, compared to those known from the prior art, a long lifetime and a high quantum yield, and emit pleasant light with good colour reproduction.

Inventive illumination devices are suitable for illumination indoors, outdoors, illumination of offices and of vehicles, and in torches, games consoles, street lights, illuminated traffic signs.

The invention further provides a process for producing colour converters comprising at least one organic colorant.

In one embodiment of the invention, a process for producing colour converters comprising an organic fluorescent dye comprises the production of a polymer film, wherein the organic fluorescent dyes are dissolved or dispersed in an organic solvent together with the matrix material and optionally scattering particles, and processed to a polymer film with homogeneously distributed dye by removing the solvent.

Other embodiments of the invention comprise the extrusion and/or injection-moulding of polystyrene or polycarbonate with organic fluorescent colorants.

EXAMPLES

Materials Used

Polymer 1: transparent homopolymer of methyl methacrylate with a Vicat softening temperature of 96° C. to DIN EN ISO 306, (Plexiglas® 6N from Evonik)

Polymer 2: transparent polycarbonate based on a polycondensate of bisphenol A and phosgene (Makrolon® 3119 from Bayer)

Polymer 3: transparent polystyrene based on a homopolymer of styrene with a density of 1048 kg/m3 and a Vicat softening temperature of 98° C. to DIN EN ISO 306 (PS 168 N from BASF SE)

Dye 1: Yellow/green-fluorescing fluorescent dye consisting of a mixture of 3,9-dicyanoperylene-4,10-bis(sec-butyl carboxylate) and 3,10-dicyanoperylene-4,9-bis(sec-butyl carboxylate).

Dye 2: Yellow/green-fluorescing fluorescent dye named N-(2,6-di(isopropyl)phenyl)perylene-3,4-dicarboxylic monoimide.

Titanium dioxide: $TiO_2$ rutile pigment from the sulphate process with a mean scattering power to DIN 53165 of 94.0 to 100 (Kronos® 2056 from Kronos Titan)

Production of the Colour Converters:

Approx. 2.5 g of polymer and 0.03% or 0.05% by weight of dye (based on the mass of the polymer) were dissolved in approx. 5 ml of methylene chloride, and 0.1% or 0.5% by weight of $TiO_2$ was dispersed therein.

The resulting solution/dispersion was coated onto a glass surface with a box-type coating bar (wet film thickness 400 µm). After the solvent had dried off, the film was detached from the glass and dried at 50° C. in a vacuum drying cabinet overnight.

Circular film pieces with a diameter of 15 mm were punched out of this film, and then served as test samples.

The following samples were produced and analyzed:

| No. | Polymer | Dye | Dye content* | $TiO_2$ content* | Film thickness |
|---|---|---|---|---|---|
| 1 | 1 | 1 | 0.05% by weight | 0.1% by weight | 57 µm |
| 2 | 2 | 1 | 0.03% by weight | 0.5% by weight | 68 µm |
| 3 | 3 | 1 | 0.03% by weight | 0.1% by weight | 73 µm |
| 4 | 1 | 2 | 0.05% by weight | 0.1% by weight | 43 µm |
| 5 | 2 | 2 | 0.03% by weight | 0.5% by weight | 69 µm |
| 6 | 3 | 2 | 0.03% by weight | 0.1% by weight | 73 µm |

*based on the amount of polymer used

Exposure of the Samples:

The samples were exposed with an exposure apparatus composed of commercially available GaN-LEDs of the Luxeon V-Star series (from Lumileds Lighting), LXH L-LR5C royal blue model, which were constructed together with reflector optics on a cooling unit. The LEDs were operated at approx. 550-700 mA, with all exposure stations set to the same intensity. The irradiation was effected with light of wavelength 455 nm. The luminance was approx. 0.09 W/cm$^2$.

Determination of the Lifetime of the Samples

For analysis, the samples were removed from the exposure stations and analyzed in the C9920-02 quantum yield measuring system (from Hamamatsu). This involved illuminating each of the samples in an integrating sphere (Ulbricht sphere) with light of 450-455 nm. By comparison with the reference measurement in the Ulbricht sphere without a sample, the unabsorbed fraction of the excitation light and the fluorescence light emitted by the sample are determined by means of a CCD spectrometer. Integration of the intensities over the unabsorbed excitation light or over the emitted fluorescence light gives the degree of absorption or fluorescence intensity or fluorescence quantum yield of each sample.

Each of the specimens was exposed constantly over a period of 20 days and removed from the exposure apparatus only to determine the degree of absorption, the fluorescence intensity and the fluorescence quantum yield of the colour converters.

FIGS. 1 and 3 show, on the abscissa, the exposure time in days and, on the ordinate, the percentage of the incident light (450-455 nm) which has been absorbed.

The numbers beside the three curves corresponds to the sample numbers.

It was found in all cases that the absorption of the light by the samples decreased with exposure time, but that the decrease in the case of inventive colour converters composed of polystyrene or polycarbonate (samples 2, 3, 5 and 6) was much slower than in the case of noninventive colour converters (samples 1 and 4).

Figure 2:
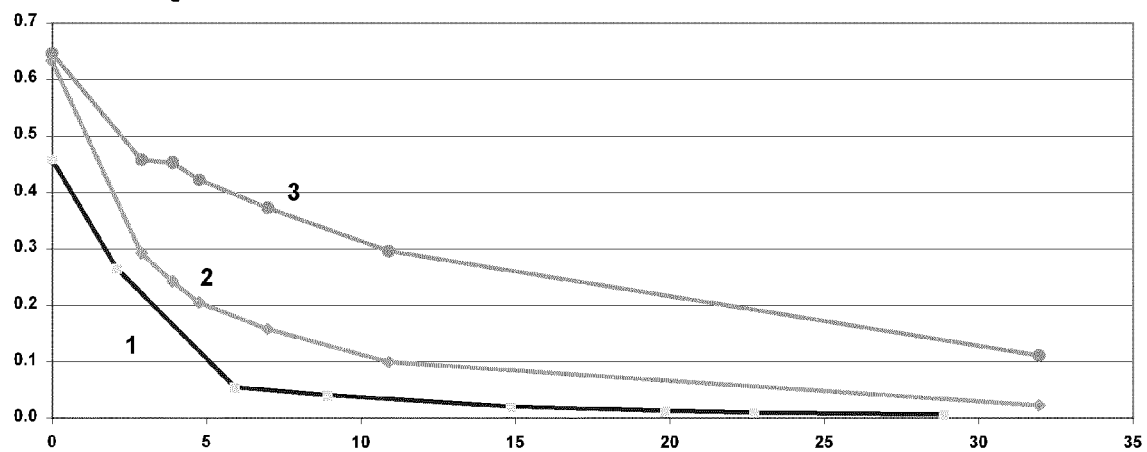

FIGS. 2 and 4 show, on the abscissa, the exposure time in days and, on the ordinate, the relative fluorescence intensity.

The numbers beside the three curves correspond to the sample numbers.

It was found in all cases that the fluorescence intensity of samples decrease with time, but that the decrease was much slower in the case of inventive colour converters of polystyrene or polycarbonate (samples 2, 3, 5 and 6) than in the case of noninventive colour converters (samples 1 and 4).

The invention claimed is:

1. An illumination device, comprising at least one LED and at least one colour converter comprising at least one organic fluorescent colorant in a matrix consisting essentially of polystyrene or polycarbonate, wherein the LED and the colour converter are present in a remote phosphor arrangement and wherein air, a noble gas, nitrogen, an other gas, or a mixture thereof are present between the colour converter and the LED.

2. The illumination device of claim 1, wherein the at least one organic fluorescent colorant is an organic fluorescent dye.

3. The illumination device of claim 1, Illumination wherein the at least one organic fluorescent colorant is a green-or red-or orange-fluorescing organic fluorescent dye.

4. The illumination device of claim 1, wherein the at least one organic fluorescent colorant is a naphthalene or perylene derivative.

5. The illumination device of claim 1, wherein the at least one organic fluorescent colorant is selected from the group consisting of

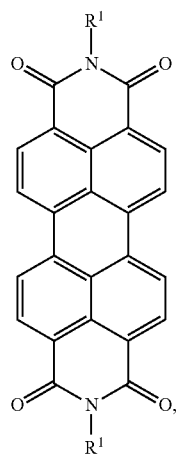

II

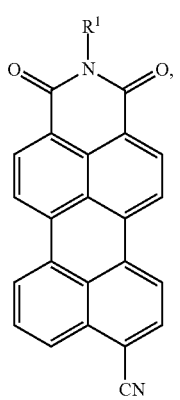

III

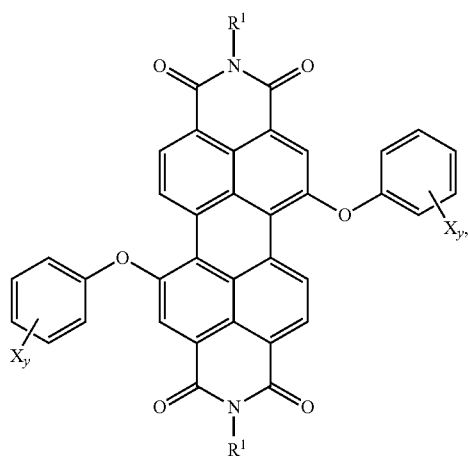

IV

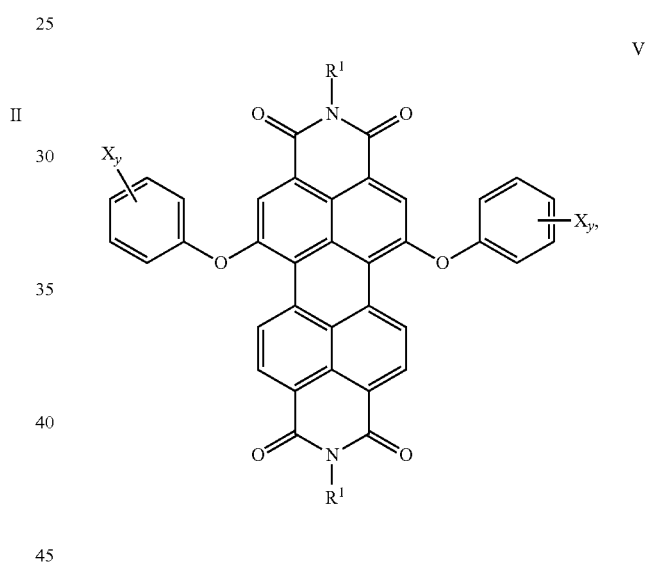

V

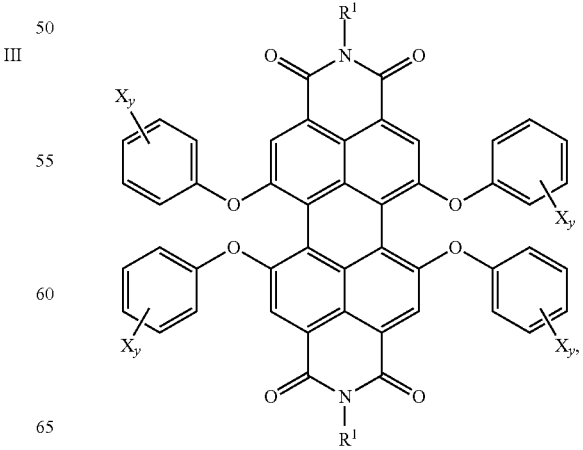

VI

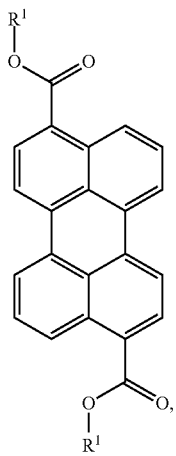

VII

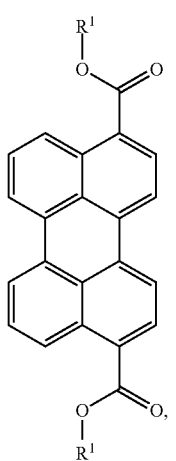

VIII

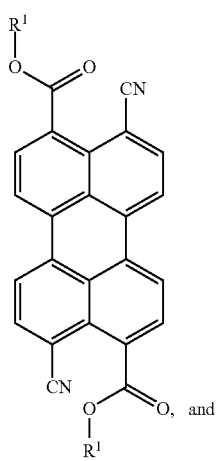

IX

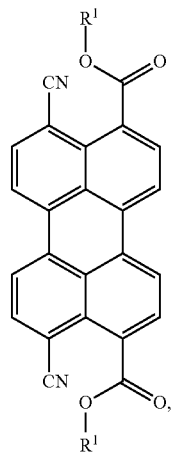

X wherein:
R¹ is a linear or branched $C_1$-$C_{18}$ alkyl radical, a $C_4$-$C_8$ cycloalkyl radical which may be mono-or polysubstituted by halogen or by linear or branched $C_1$-$C_{18}$ alkyl, or phenyl or naphthyl, where phenyl and naphthyl may be mono-or polysubstituted by halogen or by linear or branched $C_1$-$C_{18}$ alkyl;

X represents substituents in the ortho and/or para position and is linear or branched $C_1$ to $C_{18}$ alkyl; and y is a number from 0 to 3.

6. The illumination device of claim 5, wherein the at least one organic fluorescent colorant is selected from the group consisting of N,N'-bis(2,6-diisopropylphenyl)-1,7-di(2,6-di-isopropyl-phenoxy)perylene-3,4:9,10-tetracarboxdiimide, N,N'-bis(2,6-diisopropylphenyl)-1,6-di(2,6-diisopropylphenoxy)perylene-3,4:9,10-tetracarboxdiimide, 3,9-dicyanoperylene-4,10-bis(sec-butyl carboxylate), 3,10-dicyanoperylene-4,9-bis(sec-butyl carboxylate), 3,9-dicyanoperylene-4,10bis(isobutyl carboxylate), 3,10-dicyanoperylene-4,9-bis(isobutyl carboxylate), N-(2,6-di(isopropyl)phenyl)perylene-3,4-dicarboxylic monoimide, and a mixture thereof.

7. The illumination device according to claim 6, wherein the at least one organic fluorescent colorant is selected from the group consisting of N,N'-bis(2,6-diisopropylphenyl)-1,7-di(2,6-diisopropylphenoxy)perylene-3,4:9,10-tetracarboxdiimide, N,N'-bis(2,6-diisopropylphenyl)-1,6-di(2,6-diisopropylphenoxy)perylene-3,4:9,10-tetracarboxdiimide and a mixture thereof.

8. A color converter, comprising at least one organic fluorescent dye in a matrix consisting essentially of polystyrene or polycarbonate, wherein the at least one organic fluorescent dye is selected from the group consisting of N,N'-bis(2,6-diisopropylphenyl)-1,7-di(2,6-diisopropylphenoxy) perylene-3,4:9,10-tetracarboxdiimide, N,N'-bis(2,6-diisopropylphenyl)-1,6-di(2,6diisopropylphenoxy)perylene-3,4: 9,10-tetracarboxdiimide,3,9-dicyanoperylene-4,10-bis(sec-butyl carboxylate),3,10-dicyanoperylene-4,9-bis(sec-butyl carboxylate), 3,9-dicyanoperylene-4,10-bis(isobutyl carboxylate), 3,10-dicyanoperylene-4,9-bis(isobutyl carboxylate), N-(2,6-di(isopropyl)phenyl)perylene-3,4-dicarboxylic monoimide, and a mixture thereof.

9. The color converter according to claim 8, wherein the at least one organic fluorescent dye is selected from the group consisting of N,N'-bis(2,6-diisopropylphenyl)-1,7-di(2,6-di-isopropylphenoxy)perylene-3,4:9,10-tetracarboxdiimide, N,N'-bis(2,6-diisopropylphenyl)-1,6-di(2,6-diisopropylphenoxy)perylene-3,4:9,10-tetracarboxdiimide, and a mixture thereof.

10. The color converter according to claim 8, wherein the at least one organic fluorescent colorant is dissolved in the matrix.

11. The color converter of claim 8, further comprising at least one inorganic white pigment as a scattering body.

12. The color converter of claim 8, which is a film, a plaque or a sheet.

13. A process for producing the color converter of claim 8, the process comprising dissolving the at least one organic fluorescent colorant in an organic solvent together with the matrix material and optionally scattering particles, and processing a resulting mixture into a film by removing the solvent.

14. The process of claim 13, further comprising extruding and/or injection-molding the matrix with the at least one organic fluorescent colorant.

15. A process, comprising converting light produced by LEDs with at least one color converter according to claim 8.

16. A remote phosphor structure, comprising the color converter of claim 8 and at least one LED.

17. An illumination device, comprising at least one LED and at least one colour converter comprising at least one organic fluorescent colorant in a matrix consisting essentially of polystyrene or polycarbonate, wherein the LED and the colour converter are present in a remote phosphor arrangement and wherein the at least one organic fluorescent colorant is selected from the group consisting of N,N'-bis(2,6-diisopropylphenyl)-1,7-di(2,6-diisopropylphenoxy)perylene-3,4:9,10-tetracarboxdiimide, N,N'-bis(2,6-diisopropylphenyl)-1,6-di(2,6-diisopropylphenoxy)perylene-3,4:9,10-tetracarboxdiimide, 3,9-dicyanoperylene-4,10-bis(sec-butyl carboxylate), 3,10-dicyanoperylene-4,9-bis(sec-butyl carboxylate), 3,9-dicyanoperylene-4,10-bis(isobutyl carboxylate), 3,10-dicyanoperylene-4,9-bis(isobutyl carboxylate), N-(2,6-di(isopropyl)phenyl)perylene-3,4-dicarboxylic monoimide, and a mixture thereof.

18. The illumination device according to claim 8, wherein the at least one organic fluorescent colorant is selected from N,N'-bis(2,6-diisopropylphenyl)-1,7-di(2,6-diisopropylphenoxy)perylene-3,4:9,10-tetracarboxdiimide, N,N'-bis(2,6-diisopropylphenyl)-1,6-di(2,6-diisopropylphenoxy)perylene-3,4:9,10-tetracarboxdiimide, and a mixture thereof.

19. The illumination device according to claim 8, wherein air, a noble gas, nitrogen, another gas, or a mixture thereof are present between the colour converter and the LED.

* * * * *